(12) United States Patent
Lohmeier et al.

(10) Patent No.: US 11,088,013 B2
(45) Date of Patent: Aug. 10, 2021

(54) SUPPLEMENTARY TOOL FOR CHIP TRANSFER DEVICE WITH REMOVAL TOOL AND TURNING TOOL

(71) Applicant: ASM Assembly Systems GmbH & Co. KG, Munich (DE)

(72) Inventors: Sebastian Lohmeier, Munich (DE); Thomas Rossmann, Utting (DE); Michele Trigiani, Munich (DE)

(73) Assignee: ASM ASSEMBLY SYSTEMS GMBH & CO. KG

(*) Notice: Subject to any disclaimer, the term of this patent is extended or adjusted under 35 U.S.C. 154(b) by 279 days.

(21) Appl. No.: 16/163,758

(22) Filed: Oct. 18, 2018

(65) Prior Publication Data

US 2019/0122917 A1 Apr. 25, 2019

(30) Foreign Application Priority Data

Oct. 20, 2017 (DE) ..................... 10 2017 124 582.0

(51) Int. Cl.
*H01L 21/687* (2006.01)
*H01L 21/67* (2006.01)
*H01L 21/683* (2006.01)

(52) U.S. Cl.
CPC .. *H01L 21/68764* (2013.01); *H01L 21/67144* (2013.01); *H01L 21/6835* (2013.01); *H01L 21/6838* (2013.01); *H01L 21/68707* (2013.01)

(58) Field of Classification Search
CPC ........... H01L 21/67144; H01L 21/6835; H01L 21/6838; H01L 21/68707; H01L 21/6876
See application file for complete search history.

(56) References Cited

U.S. PATENT DOCUMENTS 4,626,167 A * 12/1986 Bond .................. H01L 21/6838
 414/806
4,874,076 A * 10/1989 Kaplan .................. B65B 5/105
 198/357

(Continued)

FOREIGN PATENT DOCUMENTS

EP 1 470 747 B1 5/2014
JP 2004-265886 A 9/2004
(Continued)

*Primary Examiner* — Minh N Trinh
(74) *Attorney, Agent, or Firm* — Ostrolenk Faber LLP

(57) ABSTRACT

A device for transferring chips from a wafer to a placement head of an automatic placement machine. The device includes a removal tool rotatable about a first axis of rotation (i) for the removing of singulated chips from the wafer, (ii) for turning the chips to provide them as FCOB chips at a first collection position, and (iii) for transferring, at a common transfer position, the chips to a turning tool rotatable about a second axis of rotation; and the rotatable turning tool (i) for receiving of chips from the removal tool, and (ii) for again turning the received chips, in order to provide them as COB chips at a second collection position. The removal tool has a plurality of first grippers, which are arranged protruding radially from the first axis of rotation in a first plane. The turning tool has a plurality of second grippers, which are arranged radially protruding from the second axis of rotation in a second plane. At least one rotatable tool of the removal tool and the turning tool has a first interface, at which a supplementary tool with a plurality of further grippers can be mounted, which are arranged radially protruding from a center axis in a further plane. The first interface is designed such that the center axis coincides with the first or second axis of rotation. A chip transfer system with such a device and with such a supplementary tool, a placement system with such a system, and a method for replacing a gripper in such a system.

6 Claims, 3 Drawing Sheets

(56) References Cited

U.S. PATENT DOCUMENTS

| | | | | |
|---|---|---|---|---|
| 7,028,392 B1 * | 4/2006 | Schiebel | ............ | H05K 13/0413 |
| | | | | 29/740 |
| 10,529,601 B2 * | 1/2020 | Koch | ................ | H01L 21/67721 |
| 2019/0122917 A1 * | 4/2019 | Lohmeier | ......... | H01L 21/67144 |

FOREIGN PATENT DOCUMENTS

| | | |
|---|---|---|
| JP | 2008-066472 A | 3/2008 |
| JP | 2008-251619 A | 10/2008 |
| JP | 2012-186505 A | 9/2012 |
| JP | 2017-038059 A | 2/2017 |
| KR | 2004-0073598 | 8/2004 |
| KR | 2015-0041120 | 4/2015 |
| KR | 2015-0124648 A | 11/2015 |
| WO | WO 03/065783 A1 | 8/2003 |
| WO | WO 2014/087491 A1 | 6/2014 |

* cited by examiner

SUPPLEMENTARY TOOL FOR CHIP TRANSFER DEVICE WITH REMOVAL TOOL AND TURNING TOOL

CROSS-REFERENCE TO RELATED APPLICATION

The present application claims priority to German Patent Application No. 10 2017 124 582.0, filed Oct. 20, 2017, the content of which is incorporated herein by reference.

TECHNICAL FIELD

The present invention relates in general to the technical field of placing electronic components on component holders and more particularly the placing of unpackaged electronic components designed as chips on component holders, which chips are removed directly from a finish processed wafer and supplied to a placement process. In particular, the present invention relates to a device for the transfer of chips from a wafer to a placement head of an automatic placement machine, a supplementary tool for a rotatable tool of such a device, a chip transfer system with such a device and with such a supplementary tool, as well as a placement system for the removal of chips from a wafer and for the placement of the removed chips on a component holder. The present invention moreover relates to a method for changing a gripper for the temporary receiving of a chip in such a chip transfer system.

BACKGROUND OF THE INVENTION

In order to realise a high integration density of electronic subassemblies in an efficient manner, it is known to remove electronic components designed as chips directly from a wafer and to place them using a placement head of an automatic placement machine on a component holder to be fitted with chips. With regard to their original orientation in the wafer, the chips may be placed on the component holder either in a non-flipped COB (Chip On Board) orientation or in a flipped (by 180°) FCOB (Flip-Chip On Board) orientation. Depending on the respective application, an electronic subassembly placed on a component holder may contain COB components, FCOB components, or also a combination of COB and FCOB components as a so-called mixed placement.

From document EP 1 470 747 B1 there is known a chip removal system with which a chip removed from a wafer can be transferred to a placement head either at a first transfer position in an FCOB orientation or at a second transfer position in a COB orientation. The chip removal system comprises (a) a rotatable removal tool for the removing of chips from the wafer and for turning the removed chips through 180° about their longitudinal or transverse axis, and (b) a rotatable turning tool for again turning the removed chips through 180° about their longitudinal or transverse axis, interacting in a common transfer position with the removal tool. The first collection position is associated with the removal tool and the second collection position with the turning tool. The removal of the chips is done with the assistance of a so-called ejector, which detaches a singulated chip of the wafer from an adhesive backing film and transfers it to a suction gripper of the removal tool.

An electronic subassembly placed on a component holder, apart from having COB and/or FCOB chips, may also have chips or components of different sizes. The (size) differences may be so great that different kinds of gripping tools, also called "grippers" for short in this document, need to be used. An electronic subassembly may also comprise chips such as MEMS chips, having especially sensitive surfaces and therefore needing to be handled only with a special kind of grippers.

Moreover, when supplying chips for a placement process directly from a wafer, it may be required that the sequence of detachment of chips from the wafer assembly and the sequence of providing the chips for the placement process do not match, or also deliberately should not match, especially with respect to short travel paths of a placement head. Therefore, it may be necessary to hold individual chips temporarily on the removal tool and/or on the turning tool. Such a temporary holding may be of great importance especially when the array of different chips is very large or the number of different types of chips is very large.

SUMMARY OF THE INVENTION

The problem which the invention proposes to solve is to make a transfer of chips from a wafer assembly to a placement head more flexible in that a broad array of different chips can be provided reliably and in a desired sequence as COB or as FCOB chips to the placement process.

This problem is solved by the subject matter of the independent patent claims. Advantageous embodiments of the present invention are specified in the dependent claims.

According to a first aspect of the invention, a chip transfer device is described for transferring chips from a wafer to a placement head of an automatic placement machine. The described chip transfer device comprises: (a) a removal tool rotatable about a first axis of rotation (i) for the removing of singulated chips from the wafer, (ii) for turning the removed chips to provide them as FCOB chips at a first collection position, and (iii) for transferring, at a common transfer position, the removed chips to a turning tool rotatable about a second axis of rotation; and (b) the rotatable turning tool (i) for receiving of chips from the removal tool, and (ii) for again turning the chips so received, in order to provide them as COB chips at a second collection position. The removal tool has a plurality of first grippers each for the temporary receiving of one chip, the first grippers being arranged protruding radially from the first axis of rotation in a first plane. The turning tool has a plurality of second grippers each for the temporary receiving of one chip, the second grippers being arranged radially protruding from the second axis of rotation in a second plane. At least one rotatable tool of the removal tool and the turning tool has a first interface, at which a supplementary tool with a plurality of further grippers can be mounted, which are arranged radially protruding from a center axis of the supplementary tool in a further plane. The first interface is designed such that the center axis coincides with the first or second axis of rotation when the supplementary tool is mounted.

The specified chip transfer device is based on the realisation that, with a mounted supplementary tool for the operation of the chip transfer device, an increased number of grippers is available, which can contribute in diverse ways to boosting the efficiency of the chip transfer device. The additional grippers may serve the following purposes, in particular:

(A) The additional grippers may be so-called change grippers, which are kept on hand during the operation of the chip transfer device and used when needed. This may be the case, for example, when a gripper which has been in operation (for a long time) becomes worn or when a previously used gripper needs to be exchanged for a gripper of another type, because another type of component or chip is to be processed or transferred. A change of a gripper can be done manually, semiautomatically, or fully automatically. A fully automatic changing of a gripper is especially possible for that rotatable tool which does not comprise the first interface and is not coupled to the supplementary tool. In this case, the further grippers can be mounted "upside down" on the supplementary tool, so that they can be provided to the particular rotatable tool in the proper orientation. Thanks to a suitable relative positioning between the supplementary tool and the respective rotatable tool (removal tool OR turning tool), a transfer of a no longer needed gripper to a free gripper receiving slot of the supplementary tool and a transfer of a new additional gripper to a free or vacated gripper receiving slot of the respective rotatable tool can occur.

(B) The additional grippers are used as additional temporary storage locations for chips. In this way, the holding capacity of the specified chip transfer device for chips which are removed from the wafer but not yet collected at the first collection position or at the second collection position by a placement head as FCOB or COB chips can be increased accordingly. The two rotatable tools and the supplementary tool may in fact be used not just to remove or turn over the respective chips. All (three) tools also constitute an additional chip storage, because during the operation of the chip removal device, chips for later processing can also be kept at each tool according to the particular number of grippers. The storage functionality can be employed in various ways, for example, by changing directions of rotation and/or transferring chips back in order to control the sequence and/or the times of providing of FCOB and/or COB chips in a flexible manner.

The first interface is in particular a mechanical interface, which ensures a fixed spatial arrangement of the supplementary tool with respect to the particular rotatable tool (with the first interface). If the supplementary tool is mounted on the removal tool, then the further plane is oriented parallel to the first plane. If the supplementary tool is mounted on the turning tool, then the further plane is oriented parallel to the second plane. Thus, the aforementioned planes are planes of rotation, which are oriented perpendicular to the respective axis of rotation of the respective rotatable tool. The first interface also ensures a rotationally firm connection of the supplementary tool to the rotatable tool on which the supplementary tool is mounted.

The said grippers may be in particular suction grippers or pipettes, which hold the respective chip in a conventional manner by means of a partial vacuum provided via a suction duct. The additional grippers may also be configured in particular to take up a chip temporarily each time. In place of, or in addition to, the further grippers, the supplementary tool may also contain additional chip handling tools, especially for the removal tool, and/or an ejector, which can be used during the detaching of a singulated chip from the (remaining) wafer assembly.

If the further grippers of the removal tool are suction grippers, then the first interface may also comprise a pneumatic interface, by which a partial vacuum produced by a vacuum generating unit is conveyed to suction ducts of the suction gripper, so that chips being held can be held in a conventional manner by the suction gripper. It is pointed out that the interface may furthermore comprise means of transmitting electrical energy. Means for transmitting data when necessary, such as a tool ID, information about sensors which are present, etc., may be components of the described interface.

It is pointed out that the general specification or explanation of different aspects and exemplary embodiments of the invention always describes only one supplementary tool (with one or more planes of further grippers), which is mounted either on the removal tool or on the rotatable turning tool. The rotatable tool which carries the supplementary tool is therefore generally designated as the rotatable tool with the first interface. The tool not carrying the supplementary tool is generally designated as the other rotatable tool without the first interface. In this context, however, it is pointed out that the invention is not confined to embodiments with only one supplementary tool. It is likewise possible to provide both the removal tool and the turning tool each with a supplementary tool (with one or more planes of further or additional grippers) in order to further enhance the flexibility and the performance of the chip transfer specified in this document.

According to one exemplary embodiment of the invention, the rotatable tool with the first interface comprises (a) a chassis; and (b) a displacement drive mounted on the chassis for displacing (i) the (first or second) grippers of the rotatable tool (with the first interface) and (ii) the further grippers of the supplementary tool along the (second or first) axis of rotation of the rotatable tool with the first interface. Hence, with a suitable actuation of the displacement drive, the grippers (i) of the rotatable tool with the first interface and (ii) those of the supplementary tool can be displaced (jointly) along the respective axis of rotation. Thus, a selected plane of the parallel planes can be positioned flush with the first or second plane of the other rotatable tool (without the first interface). In this way, by means of the common transfer position, the other rotatable tool (without the first interface) can be functionally coupled to the grippers or to corresponding gripper receiving locations associated with the selected plane for the purposes of transferring of chips and/or of (change) grippers.

Naturally, upon activating of the displacement drive, a displacement of the grippers of the supplementary tool occurs only if the supplementary tool is also in fact mounted on the rotatable tool (with the interface).

According to another exemplary embodiment of the invention, the chip transfer device moreover comprises a pneumatic interface for the controlled application of a partial vacuum to the (second or first) grippers of the rotatable tool with the first interface. The application may occur under control or regulation. This has the advantage that so-called suction grippers or suction pipettes can be used as the grippers, which as is known makes possible an especially gentle yet reliable temporary gripping of chips.

According to another exemplary embodiment of the invention, the chip transfer device moreover comprises a pneumatic shunt element, which is connected downstream of the pneumatic interface and which is configured to apply a partial vacuum only to those grippers associated with a selected plane of grippers, depending on its current position. This has the advantage that a partial vacuum is applied only to those (suction) grippers that are presently "in operation" and being used. The term "in operation" or "being used" can mean, in particular, that only those (suction) grippers of the rotatable tool with the first interface that are interacting, due to the current position of the aforesaid displacement drive (by means of the common transfer position), with grippers of the other rotatable tool without the first interface with respect to a transfer of chips, are supplied with a partial vacuum.

The pneumatic shunt element can be coupled to a partial vacuum line at its inlet end and comprise at least two (preferably individually) activatable pneumatic outputs at its output end. The number of pneumatic outlets and/or the number of "shunt positions" may be as large as the number of planes of grippers provided by the rotatable tool with the first interface and the supplementary tool together.

In this context, it is pointed out that in the event that the grippers of a further plane are used for a temporary storing of chips, the pneumatic shunt element may also adopt an operating state in which the (suction) grippers associated with more than one plane are subjected to a partial vacuum.

According to another exemplary embodiment of the invention, the pneumatic shunt element is coupled to the displacement drive such that those grippers associated with the selected plane of grippers are automatically subjected to a partial vacuum. This has the advantage that no separate actuation is required for the operation of the shunt element, since the displacement drive constitutes the "actuator" for the shunt element.

The described coupling between the displacement drive and the shunt element may occur in a simple and efficient manner, for example by the shunt element being moved or actuated by a driver element, which is mechanically coupled to a movable component of the displacement drive. The shunt element for example may be realised as a so-called spool valve, comprising a sleeve and a piston able to move in the sleeve along the longitudinal axis of the sleeve, being in engagement with the driver element. A central bore in the piston may be the aforementioned pneumatic inlet. Openings in the sleeve, by which a suitable transverse bore can be pneumatically coupled individually to the pneumatic inlet, may be the aforementioned pneumatic outlets.

According to another exemplary embodiment of the invention, the chip transfer device moreover comprises a plurality of actuable radial drives, wherein each radial drive is associated with one of the grippers of the removal tool, the turning tool and the supplementary tool so that the respective gripper can be moved in the radial direction with respect to the particular axis of rotation.

With the described radial drives, the chips being transferred may be handled especially gently. In particular, thanks to a suitable gentle yet rapid radial reciprocating motion, it is possible to pick up chips from the wafer or the wafer assembly with high process safety and transfer them at the common transfer position of the removal tool and/or the supplementary tool to the turning tool or the supplementary tool. The same also holds for a transfer of so-called (change) grippers between the supplementary tool and the rotatable tool with the first interface.

The "plurality of actuable radial drives" may be realised in particular with a plurality of individual radial drives, which can each be actuated individually and independently of each other. The "plurality of actuable radial drives" in other embodiments may also be realised by a common radial drive with a suitable coupling mechanism, which ensures that each time, the gripper which is in a definite angular position with respect to the rotation of the respective rotatable tool is moved. For a radial movement of the gripper, for example, such a common radial drive may be situated in a fixed angular position with respect to the axis of rotation of the respective rotatable tool. This means that only the gripper which is currently in the angular position associated with the respective radial drive can be moved in the radial direction. This may occur in particular by a coupling mechanism with suitably designed and movable driving and engaging elements, which are brought into mechanical engagement only if the respective gripper is in the angular position associated with the respective radial drive during its rotation about the axis of rotation of the respective tool.

According to another exemplary embodiment of the invention, the grippers of the rotatable tool without the first interface are each associated with a radial drive. This has the advantage that the total number of radial drives can be kept low, without any (significant) sacrifice in functionality and/or process certainty. In particular at the common transfer position the fact is utilized that a reliable transfer of a chip, requiring a simultaneous contact by two grippers at the time of the transfer: (i) a gripper of the removal tool or the supplementary tool mounted on the removal tool and (ii) a gripper of the turning tool or a supplementary tool mounted on the turning tool, is also possible without limitation when only one of the two grippers involved is radially actuated. In this context, "radially actuated" means that the respective gripper can be displaced radially by means of a suitable actuator.

Preferably, the removal tool is the rotatable tool having radially actuated grippers. This has the advantage that not only the transfer of a chip at the common transfer position but also a removal of chips from the wafer may occur in a reliable manner by a suitable radial reciprocating motion.

Preferably, in particular, the removal tool comprises two common radial drives. A first common radial drive is associated with the angular position of the removal tool in which the removal of the chips from the wafer is performed. This, especially in conjunction with a specified ejector tool, makes possible a reliable removal of the chips from the wafer. A second common radial drive in such an embodiment is associated with the angular position of the removal tool in which a transfer of chips to the turning tool occurs. Preferably, the removal of chips from the wafer occurs at the so-called 6 o'clock position and/or a transfer of chips between the removal tool and the turning tool at the so-called 9 o'clock position of the removal tool. Further preferably, the 9 o'clock position of the removal tool corresponds to the 3 o'clock position of the turning tool.

According to another exemplary embodiment of the invention, no radial drive is associated with the grippers of the other rotatable tool with the first interface and/or the grippers of the supplementary tool. This may mean, in particular, that the respective grippers are in a fixed and unchangeable position with respect to their radial spacing from the respective axis of rotation. The mechanical layout of the rotatable tool with the first interface and/or that of the supplementary tool may in this way be kept simple and manageable.

It is pointed out that a radial "actuability" of the grippers which are at the first collection position or at the second collection position is not necessary in practice in order to transfer the chips in a gentle and reliable manner to a placement head. Specifically, a placement head is typically outfitted with a so-called z-drive, which can generally move a gripper of the placement head relative to a chassis of the placement head along a vertical z-direction, in order to make possible both a gentle and reliable picking up of a component or chip and a gentle and reliable setting down of a chip or component on a component holder. This displaceability of the gripper of a placement head is enough to also ensure a gentle and reliable transfer of a chip from the removal tool at the first collection position or the turning tool at the second collection position to the respective placement head.

According to another exemplary embodiment of the invention, the first grippers, the second grippers and/or the further grippers are spring-mounted at least in the radial direction. This enables, in advantageous manner, a gentle handling of the chips during all transfer operations. In particular, this involves the transfer operations: (i) a removal of the chips from the wafer, (ii) a transfer of the chips between the removal tool and the turning tool, (iii) a picking up of FCOB chips by the placement head and/or (iv) a picking up of COB chips by the placement head or a further placement head.

The spring mounting can be realised in particular by simple passive spring elements, which ensure that the respective suction gripper is spring mounted on its tool in the radial direction.

According to another aspect of the invention, a supplementary tool for a chip transfer device is described, especially for a chip transfer device of the kind described above. The specified supplementary tool comprises: (a) a plurality of further grippers, which are arranged protruding radially from a center axis of the supplementary tool in a further plane; (b) a second interface, by means of which the supplementary tool can be mounted on a first interface of a rotatable tool of the chip transfer device such that (i) the further plane is oriented parallel to a plane of the rotatable tool (with the first interface) within which a plurality of (first or second) grippers protrude radially from an axis of rotation, and that (ii) the mounted removal tool rotates together with the rotatable tool (with the first interface) about the same axis of rotation during a rotation of the rotatable tool (with the first interface).

The described supplementary tool is based on the realisation that the functionality and/or the performance or capability of a chip removal system, such as the one known for example from EP 1 470 747 B1, can be improved by coupling the supplementary tool by multiple further grippers to the removal tool or to the turning tool by means of suitable interfaces (on both sides). In this way, an increased number of grippers available for chips is accomplished in a simple design. The additional grippers, as already described above, may be used either for an (automatic) changing of grippers or for increasing the number of available temporary storage locations for chips.

According to one exemplary embodiment of the invention, the supplementary tool moreover comprises a plurality of additional grippers protruding radially from the center axis in an additional plane. The additional plane is offset in relation to the further plane along the center axis. Moreover, the additional plane is oriented parallel to the further plane.

The providing of further (gripper) planes may have the advantage, in particular, that the number of the total grippers available can be increased in an easy manner. In particular, it is not necessary to reduce the pitch distance on the circumference of the respective tool between two neighboring grippers, which would result in a reduction of the spacing between grippers along the circumferential direction.

With a correspondingly high number of total available grippers, it is thus possible for different kinds of grippers to be present, so that each time, a suitable gripper can be used for a broad array of chips. Alternatively or in combination it becomes possible to provide a plurality of (change) grippers, which may also optionally include different kinds of grippers. In this way, the flexibility of the chip transfer system described in this document can be significantly increased.

It is pointed out that the number of additional planes (each with a plurality of additional grippers) is not limited. Instead, the specified supplementary tool can be outfitted with a suitable number of planes, each with a plurality of grippers, for each application instance.

According to another exemplary embodiment of the invention, the supplementary tool comprises a locking mechanism which (i) in a first position secures the further grippers to a chassis of the supplementary tool and (ii) in a second position unlocks at least one of the further grippers for the purpose of a removal of the gripper. In this way, it can be prevented in reliable manner that further grippers will accidentally fall off the chassis and hinder a transfer of chips from the wafer to an automatic placement machine downstream from the chip transfer device. In this way, the process reliability can be assured for all components involved in the chip transfer.

The locking mechanism may be coupled to an actuator, which can switch the locking mechanism, especially between the two positions "locked" and "unlocked". Moreover, a suitable sensor can be provided, which recognizes the current position of the locking mechanism and relays corresponding information to a control unit. A high operational reliability can then also be assured with regard to the exchange of grippers.

According to another aspect of the invention, a chip transfer system for the transfer of chips from a wafer to a placement head of an automatic placement machine is described. This chip transfer system comprises (a) a chip transfer device of the kind described above; and (b) a supplementary tool as claimed in one of the preceding claims, which is mounted by its second interface on the first interface of the chip transfer device.

The described chip transfer system for the transfer of chips is based on the realisation that, by combining the above described supplementary tool with a chip removal system as known from EP 1 470 747 B1, for example, having a rotatable removal tool and a rotatable turning tool, a functionally expanded chip feeding system can be created in relatively simple manner. The resulting chip feeding system, thanks to an increased number of available grippers, has an especially high flexibility, especially with regard to the processing of different types of chips and/or with regard to a temporary storing of chips already detached from the wafer assembly but not yet transferred to a placement head.

According to another exemplary embodiment of the invention, the first interface and/or the second interface is configured such that the supplementary tool can be mounted with repeated accuracy in a distinct angular position on the rotatable tool with the first interface. In this way, a defined mounting of the supplementary tool on the respective rotatable tool is assured in an advantageous manner, even when this mounting is done by an inexperienced or unskilled attending person.

A releasable fixation in a distinct angular position can be done by an attending person with a suitable implement or with no implement. Alternatively, an automatic fixation or a releasing of same can also be done automatically and in particular brought about by a control unit of the described chip transfer system for the transfer of chips.

According to another exemplary embodiment of the invention, the first interface and/or the second interface is configured such that the supplementary tool can be secured by means of a partial vacuum on the rotatable tool with the first interface.

A pneumatic and thus also a releasable fixation of the supplementary tool on the respective rotatable tool may be realised in a simple and efficient manner in that, by means of a suitable valve assembly, a partial vacuum, which is needed anyway for the use of suction grippers, is also used for the pneumatic fixation. The partial vacuum may provide a nonpositive fixation of the supplementary tool on the respective rotatable tool. Alternatively, a brief pneumatic pulse (negative as partial vacuum or positive as overpressure) may serve as a pneumatic switching pulse, which causes a fastening mechanism to switch between a first state and a second state. In the first state, a fixation of the supplementary tool to the respective rotatable tool occurs, whereas in the second state a previous fixation of the supplementary tool to the respective rotatable tool is canceled.

According to another exemplary embodiment of the invention, those grippers which are associated with a particular plane are grippers of the same kind.

The use of grippers of the same kind for a gripper plane has the advantage that the operation of the described chip transfer system is simplified, because one no longer has to monitor or give consideration at every moment to the types of grippers which are present in the different angular positions of the respective tool, i.e., the removal tool, the turning tool and/or the supplementary tool. In this way, the control system of the chip transfer is simplified and the process reliability is enhanced.

According to another exemplary embodiment of the invention, the grippers which are associated with different planes are grippers of different kinds. This has the advantage that different kinds of grippers are present, so that each time, a particularly suited gripper can be used for a broad array of differently dimensioned chips. Alternatively or in combination, it is possible in a simple and reliable manner to provide different types of (change) grippers. In this way, the flexibility of the described chip transfer system for the transfer of chips can be significantly increased, especially as regards the manufacturing of many different electronic subassemblies.

According to another exemplary embodiment of the invention, an equal number of grippers are associated with different planes of grippers. Alternatively or in combination, an unequal number of grippers are associated with different planes of grippers. Thanks to a suitable adaptation to the number of grippers for a plane, the described chip transfer system can be optimized in terms of different requirements.

According to present experience, it appears to be expedient for a plane to comprise, for example 2, 4, 8, 12, 16, 20 or 24 grippers. It is generally advisable for the number of grippers per plane in the removal tool to be less than the number of grippers per plane in the turning tool and/or in the supplementary tool, insofar as this is mounted on the turning tool.

According to another exemplary embodiment of the invention, (a) two immediately neighboring planes of grippers comprise an equal number of grippers and (b) the grippers of the one (neighboring) plane are arranged with an offset in terms of their angular position about the (first or second) axis of rotation as compared with the grippers of the other (neighboring) plane, preferably by half the angular pitch distance. This has the advantage that the grippers can be arranged very compactly in space. In this way, all the planes provided can be realised within a relatively small axial design space.

According to another exemplary embodiment of the invention, the supplementary tool comprises, besides the further plane with further grippers, at least one additional plane with a plurality of additional grippers. Moreover, the grippers of at least one plane are change grippers, which can replace a gripper after it becomes worn down. Alternatively or in combination, the grippers of at least one other plane are of a different type than the grippers of the rotatable tool with the first interface. This has the advantage that the rotatable tool expanded with the supplementary tool can handle different components in a time-optimal fashion, without changing grippers. Alternatively or in combination, the supplementary tool may also provide change grippers of one or more different types.

It is pointed out that these advantages hold both for an embodiment in which the supplementary tool is mounted on the removal tool and for an (other) embodiment in which the supplementary tool is mounted on the turning tool.

According to another exemplary embodiment of the invention, one gripper receiving location is provided for each first gripper, for each second gripper and/or for each further gripper. Moreover, the number of gripper receiving locations, especially the number of gripper receiving locations per plane of the supplementary tool, which gripper receiving locations are respectively associated with a change gripper, is greater than the number of gripper receiving locations, especially the number of gripper receiving locations per plane of the rotatable tool which interacts with the supplementary tool by means of the common transfer position.

As long as the number of gripper receiving locations of the supplementary tool, each of which is associated with a change gripper, is greater by one (than the number of gripper receiving locations of the rotatable tool which is interacting with the supplementary tool by means of the common transfer position), it is possible in an advantageous manner to provide a complete second set of change grippers. The free gripper receiving location of the supplementary tool can then be used to change the grippers of the rotatable tool in succession.

As long as the number of gripper receiving locations of the supplementary tool, each of which is associated with a change gripper, is greater by a multiple (e.g., a multiple of four) plus one, multiple complete sets of change grippers can be kept on hand in the supplementary tool and used in succession for a gripper change by occasional use of the at least one free gripper receiving location.

The gripper receiving locations may each comprise a simple sleeve, on which a gripper can be mounted. These sleeves may also be called quills or hollow-bore working spindles. The above described radial drives may be coupled in particular with these sleeves and may move these sleeves (together with a gripper mounted thereon) in the radial direction.

According to another exemplary embodiment of the invention, the chip transfer system moreover comprises (a) a reading device; and (b) an encoding, which can be read by the reading device.

The encoding may in particular be an encoding distinctly identifying the respective component, so that the reading device and optionally an evaluation device connected downstream can clearly identify that the supplementary tool has been added to the respective rotatable tool and also which individual supplementary tool has been added. Put more clearly, after the mounting of the supplementary tool, an automatic identification can occur by means of the reading device and optionally a downstream control unit of the described chip transfer system or the automatic placement machine. In this way, parameters required for the actuating of the described chip transfer device or the described chip transfer system for the transfer of chips can be adapted automatically. These parameters, for example, may be indicative of the geometry or the dimensions of the supplementary tool and/or may represent calibration factors. Preferably, the encoding is a machine-readable optical encoding (barcode, QR code, etc.) and/or an electromagnetically readable encoding (e.g., RFID).

It is pointed out that in the case of an optically readable encoding, the reading device may also be realised by means of a camera system already used for other purposes. One example of such a camera system which can be outfitted with the additional functionality of the reading of the described encoding is a so-called circuit board camera of the automatic placement machine, by means of which optical readable markings can be detected on a component holder being fitted with components.

According to another aspect of the invention, a placement system for the removal of chips from a wafer and for placing the removed chips on a component holder is described. The described placement system comprises (a) a chip transfer device of the kind described above; and (b) an automatic placement machine with a placement head for the collecting of FCOB chips provided at the first collection position and/or for the collecting of COB chips provided at the second collection position.

The specified placement system is based on the realisation that the above chip transfer device and/or the above described chip transfer system can be functionally coupled to an automatic placement machine such that, with no further chip handling steps, unpackaged components or chips can be placed on a component holder, especially a circuit board.

According to another aspect of the invention, a method is described for changing a gripper for the temporary receiving of a chip in a chip transfer system of the above described type for the transfer of chips from a wafer to a placement head of an automatic placement machine. The method involves (a) a positioning of the turning tool in relation to the removal tool such that the mounted supplementary tool and the rotatable tool without the first interface reach a common transfer position in which a gripper can be transferred between the rotatable tool and the supplementary tool; (b) a rotating of the rotatable tool without the first interface such that a no longer needed gripper of the rotatable tool without the first interface is situated at the common transfer position; (c) a rotating of the supplementary tool such that a free gripper receiving location of the supplementary tool is situated at the common transfer position; (d) a transfer of the no longer needed gripper to the supplementary tool; (e) a rotating of the supplementary tool such that a new gripper is situated in the common transfer position; and (f) a transfer of the new gripper to the rotatable tool without the first interface.

The specified method is based on the realisation that the above described supplementary tool can be used as a storage device for (change) grippers, which can be used as needed by the rotatable tool which is not coupled to the supplementary tool by means of the two interfaces. An automatic replacement of old or previously used grippers can be done, e.g., when the gripper is worn down and needs to be replaced with a new or at least a newer gripper. Moreover, a replacement of a gripper may also be indicated when a different type of gripper is required for the handling of different chips or when advisable for purposes of good operating reliability.

With the specified method, the particular suitable grippers can be kept on hand in an efficient manner for a broad array of different chips and an optimally suitable gripper can be put in use automatically for the particular chip being transferred for the temporary holding of that chip. A changing of the gripper being used can be realised in ongoing operation of the chip transfer device or in ongoing operation of the automatic placement machine downstream from the chip transfer device within a minimal refitting time. Moreover, a suitable gripper refitting may be program controlled and may take place with no manual intervention by an attendant.

The described positioning is a relative positioning. This means that at least one of the removal tool and the turning tool (in a coordinate system fixed in space) travels along at least one of three degrees of translational freedom, so that the common transfer position of the rotatable tools involved in the transfer, i.e., the supplementary tool and the rotatable tool not coupled to the supplementary tool, is reached. This positioning involves in particular a displacement of the removal tool along the first axis of rotation and/or a displacement of the turning tool along the second axis of rotation, so that the further plane (of the further grippers) coincides with the first plane (of the first grippers in the case of a transfer of a gripper between removal tool and supplementary tool) or the second plane (of the second grippers in the case of a transfer of a gripper between turning tool and supplementary tool).

The described gripper changing may be requested and possibly also controlled in particular by a control unit of the chip transfer device, of the chip transfer system, or of an automatic placement machine. Preferably, the gripper change is initiated only when there are no more chips present on both rotatable tools.

According to another exemplary embodiment of the invention, the supplementary tool is mounted on the turning tool. This makes possible in advantageous manner an at least semiautomatic and preferably fully automatic changing of a gripper of the removal tool.

According to another exemplary embodiment of the invention, the supplementary tool is mounted on the removal tool. This makes possible in advantageous manner an at least semiautomatic and preferably fully automatic changing of a gripper of the turning tool.

It is pointed out that a changing of a gripper for grippers which are mounted on the rotatable tool with the first interface is also possible. In this case, specifically, the gripper change may occur directly or indirectly via the other rotatable tool without the first interface. Specifically, this means that the new gripper is at first transferred to a free location of the other rotatable tool, or one that is made free. After this, the new gripper can then be transferred to the location previously made free on the rotatable tool with the first interface, in which location the gripper being replaced by the new gripper was previously present.

According to another exemplary embodiment of the invention, the transfer of the no longer needed gripper to the supplementary tool and/or the transfer of the new gripper to the rotatable tool without the first interface involves an activation or actuation of a radial drive of the rotatable tool. This has the advantage that a gentle transfer can occur in a gentle manner and with high process reliability, especially for a change gripper (as well as a gripper being replaced). A further advantage of this embodiment is that the number of radial drives required for the chip transfer system can be minimized, and thus the apparatus expense can be simplified and the costs for the chip transfer system can be kept relatively low. Given the fact that typical placement heads have a z-drive for their grippers, this means that in practice no limitations in terms of functionality and process reliability need to be accepted in such an embodiment. This advantage has already been explained above in detail.

It is pointed out that embodiments of the invention have been described with respect to different subject matter of the invention. In particular, some embodiments of the invention have been described with device claims and other embodiments of the invention with method claims. However, it will become clear to the skilled person upon reading this application that, unless otherwise explicitly stated, in addition to a combination of features belonging to one type of subject matter of the invention, any given combination of features belonging to different types of subject matter of the invention is possible.

Before describing exemplary embodiments of the invention with reference to the set of drawings, some technical considerations in connection with the invention shall be presented below.

The aim of the present invention is to provide a chip feeding device, termed in this document a chip transfer system, which can be retrofitted for the handling of components or chips of waferlike form and different configurations in routine operation and without the intervention of an attendant. In order to realise the compact dimensions of an overall automatic placement machine as demanded by many users, the devices for the changing of suction grippers should take up only minimal space within the feeding device. Therefore, a changing of suction grippers, where necessary, should employ only actuated degrees of freedom of the feeding device or the automatic placement machine that are required anyway for the realisation of the removal, handling, and placement processes. Furthermore, actuated degrees of freedom which are provided for the compensation of tolerances between individual functional elements of the feeding device may be used.

One part of the feeding device which is especially relevant to the invention consists of a removal tool and a turning tool. Furthermore, the automatic placement machine into which the feeding device is integrated comprises a placement head with multiple suction grippers for picking up, transporting, and setting down components or chips in the course of a placement process. With the removal tool, chips are removed from the substrate of a wafer and provided to the placement head in FCOB orientation. For COB applications, the components are transferred by the removal tool to the turning tool and provided to the placement head. The turning tool may furthermore be used for an interim storage of chips.

As compared with a known system, in particular the chip removal system described in EP 1 470 747 B1, the chip transfer system described in this document has the following advantages in particular:

(a) The functionality is expanded, especially that of the turning tool, so that an automated retrofitting of the chip transfer system is possible by means of a change of suction grippers for the feeding of chips of different kinds.

(b) The turning tool can be outfitted with the functionality of a storage device for chips and/or suction grippers needed for the chip transfer system and/or the downstream automatic placement machine. In particular, change (suction grippers) may be kept ready for the removal tool and used for an automatic changing of suction grippers.

(c) In a corresponding configuration of the chip transfer system, not only suction grippers of the turning tool but also suction grippers of the removal tool can be changed (automatically).

Further advantages and features of the present invention will emerge from the following exemplary description of currently preferred embodiments. The individual figures of the set of drawings of this document should only be considered to be schematic and not true to scale.

DETAILED SPECIFICATION

Figure 1:
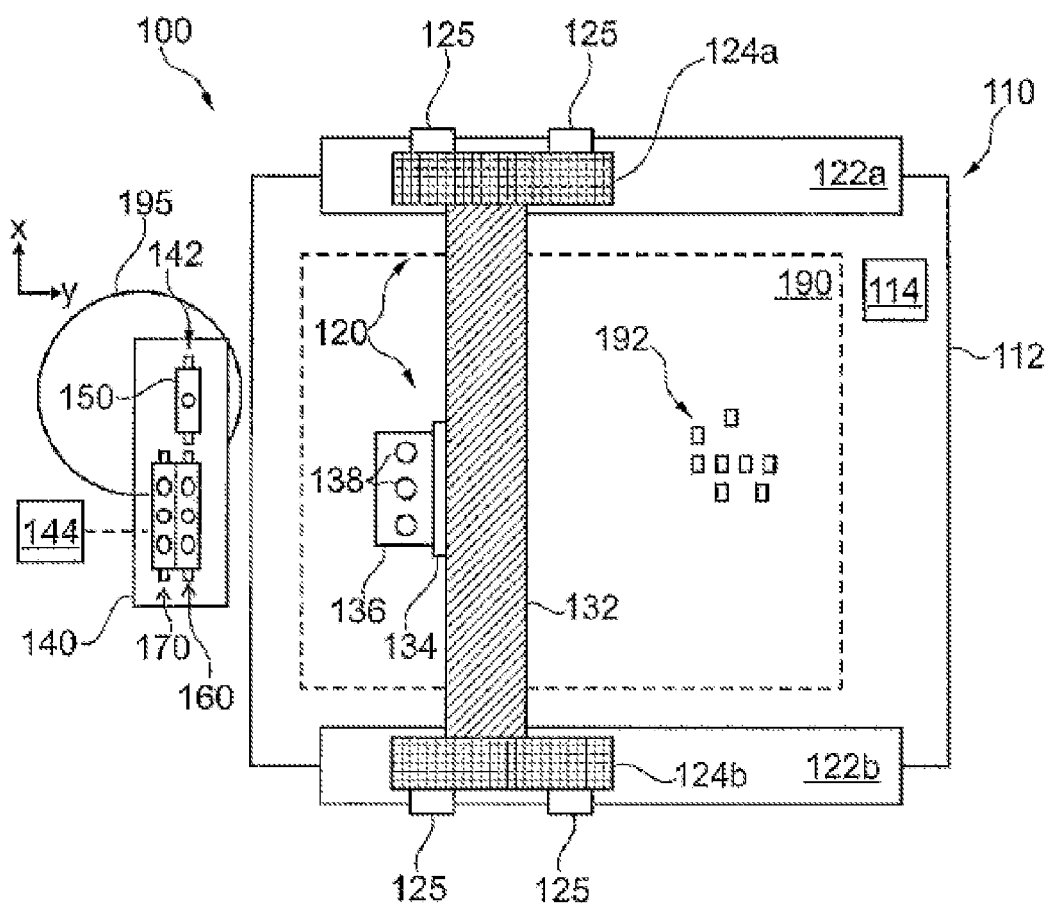
FIG. 1 shows in a top view a schematic representation of a placement system with a chip transfer system according to one exemplary embodiment of the invention.

It is pointed out that features or components of different embodiments, which are identical or at least functionally identical to the corresponding features or components of another embodiment, are given the same reference numbers or provided with reference numbers which are identical in the last two digits to the reference numbers of corresponding identical or at least functionally identical features or components. To avoid unnecessary repetition, features or components already explained in reference to a previously described embodiment will not be explained in detail in a later place.

Moreover, it is pointed out that the following described embodiments represent only a limited selection of possible variant embodiments of the invention. In particular, it is possible to combine the features of individual embodiments in suitable manner so that a variety of different embodiments may be seen as being obviously disclosed to the skilled person with the variant embodiments explicitly represented here.

Furthermore, it is pointed out that space-related terms such as "front" and "rear", "top" and "bottom", "left" and "right", etc., are used to describe the relationship of one element to another element or to other elements, as illustrated in the figures. Accordingly, the space-related terms may hold for orientations that differ from the orientations represented in the figures. However, it goes without saying that all such space-related terms, for sake of clarity of the description, pertain to the orientations represented in the drawings and are not absolutely limiting, since the respectively portrayed device, component, etc. when in use may adopt orientations which can differ from the orientations portrayed in the drawing.

FIG. 1 shows, in a schematic representation, a placement system 100 with a chip transfer system 140 and an automatic placement machine 110. The automatic placement machine 100 corresponds substantially, especially in its design features, to a conventional automatic placement machine. The basic function of the automatic placement machine 110 and various components, not represented, shall therefore not be explained in detail in the following.

The automatic placement machine 110 comprises a chassis 112, which is shown schematically by a solid line in FIG. 1. This chassis 112 provides a frame structure on which the individual components of the automatic placement machine 110 can be mounted directly or indirectly.

On the chassis 112 is mounted a gantry system 120, which comprises two guide elements in familiar fashion, constituting a gantry base. According to the exemplary embodiment represented here, this gantry base is formed by a first guide element 122a as well as a further first guide element 122b. The two first guide elements 122a and 122b each have an elongated carrier rail, extending along a first direction. In FIG. 1, this first direction is denoted as a y-direction.

The gantry system 120 moreover comprises two carriages 124a and 124b. The carriage 124a is mounted movably on the guide element 122a, so that it can travel or be positioned by means of a drive, not shown, along the y-direction. In corresponding manner, the carriage 124b is mounted movably on the guide element 122b. A drive, likewise not shown, ensures that the two carriages 124a and 124b can travel in the same way or synchronously along the y-direction. Bearing elements 125 ensure that the two carriages 124a and 124b are moved in a reliable manner along a precisely defined track along the y-direction.

Between the two carriages 124a and 124b there extends a second guide element 132, designed as a movable cross beam, having a longitudinal extension along a second direction. This second direction is designated in FIG. 1 and hereinafter as the x-direction. On the cross beam 132 there is mounted or guided a second carriage 134, which can be moved or positioned along the x-direction by means of a drive, likewise not shown. This second carriage 134 constitutes a mechanical platform, on which a placement head 136 is secured. According to the exemplary embodiment represented here, the placement head 136 is a so-called multiple placement head, comprising multiple chip holding devices 138 designed as suction pipettes or suction grippers, which can be used in a known manner for the temporary holding of an electronic component.

For the placing of chips on a component holder 190, the placement head 136 is moved in known manner by a suitable actuation of the gantry system 120 first into a component collection region, not shown, where unpackaged wafer-like components or chips 192 are provided by the chip transfer system 140. Here, the provided chips 192 are collected by the placement head 136 and transferred once more by a suitable actuation of the gantry system 120 to a placement region, in which the chips 192 are set down on the component holder 190.

A data processing unit 114 ensures a coordinated actuation of the drives for the two carriages 124a, 124b, for the placement head 136 and for other components of the automatic placement machine 110 which are familiar to the skilled person. One such component is, for example, a transport system, which is provided for bringing the component holder 190, before it is fitted with chips, into the automatic placement machine 110, and for removing it once more from the automatic placement machine 110 after it has been at least partially fitted with chips. According to the exemplary embodiment represented here, the data processing unit 114 is coupled to a data processing unit 144 which controls a chip transfer system 140 such that its operation is synchronized with the operation of the automatic placement machine 110. For clarity of representation, the communication link between the two data processing units 114 and 144 is not shown in FIG. 1. Of course, the two data processing units 114 and 144 may also be realised by means of a single common data processing unit. This may be realised, in particular, by implementing the functionality of the data processing unit 144 in the data processing unit 114 of the automatic placement machine 110.

The chip transfer system 140 comprises a chip transfer device 142 and a supplementary tool 170. The chip transfer device 142 comprises a rotatable removal tool 150 and a rotatable turning tool 160. According to the exemplary embodiment represented here, the supplementary tool 170 is mounted on the turning tool 160. The removal tool 150 cooperates with the turning tool 160 or with the supplementary tool 170 at a common transfer position, not shown in FIG. 1, with regard to a transfer of chips 192 and/or a transfer of (change) suction grippers. The axes of rotation of the two tools 150 and 170 are oriented parallel to the y-direction indicated at upper left in FIG. 1. A temporary holding of chips 192 from a wafer 195 by the removal tool 150 occurs with the aid of suction grippers, not given a reference number, which are distributed along an outer circumference of the removal tool 150 and protrude radially outward from the axis of rotation of the removal tool 150. In corresponding manner, a temporary holding of chips 192 provided by the removal tool 150 can be done by the turning tool 160 or the supplementary tool 170 with the aid of suction grippers, likewise not given a reference number, which are distributed along an outer circumference of the turning tool 160 or the supplementary tool 170 and protrude radially outward from the axis of rotation of the turning tool 160.

According to the exemplary embodiment represented here, the chip transfer system 140 is mounted stationary in space on the automatic placement machine 110. This means that, when removing various chips 192 from the wafer 195, the wafer 195 has to be moved by means of a suitable xy-positioning system, not shown, in order to allow the removal tool 150 access to different positions or different chips 192 of the wafer 195.

Figure 2:
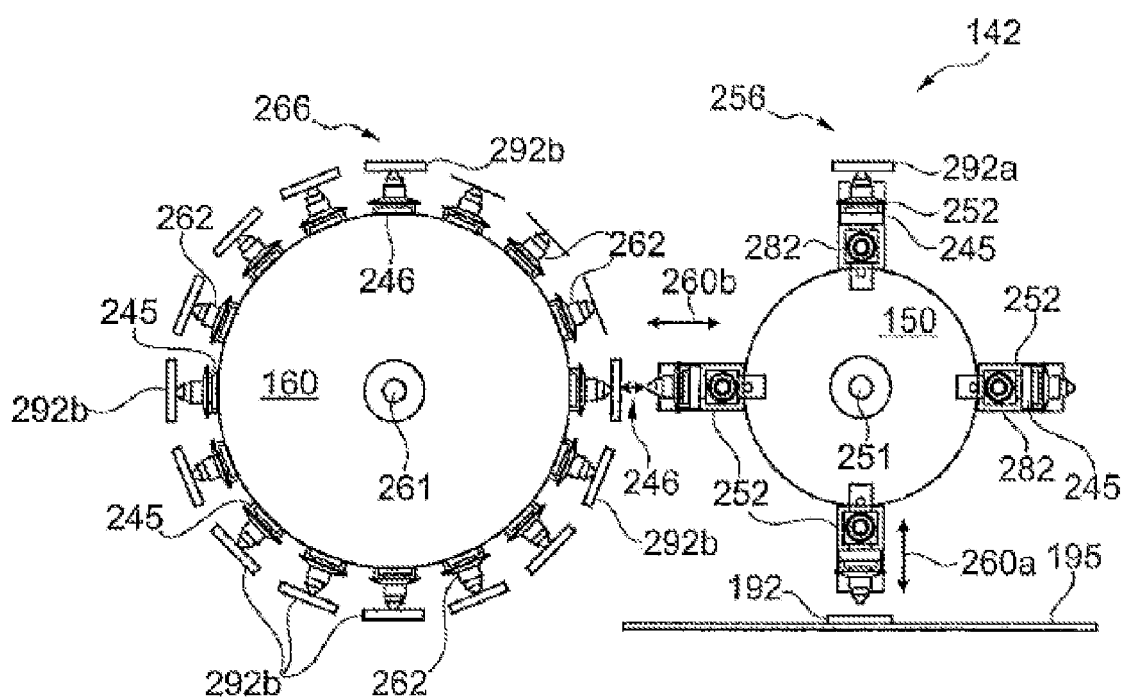
FIG. 2 shows in a side view a chip transfer device (without a supplementary tool mounted) for the providing of (i) COB chips and (ii) FCOB chips.

FIG. 2 shows in a side view a chip transfer device 142 (without a mounted supplementary tool) for the providing of (i) COB chips 292a and (ii) FCOB chips 292b. The COB chips 292a are provided at a first collection position 256 to a placement head, not shown, for purposes of being collected and then placed on a component holder. The FCOB chips 292b are provided at a second collection position 266 to the placement head or to another placement head, also not shown.

According to the exemplary embodiment represented here, the removal tool 150 comprises four first suction grippers 252. The turning tool 160 comprises a total of 16 second suction grippers 262. The removal tool 150 is rotatable about a first axis of rotation 251, the turning tool 160 rotates during operation about a second axis of rotation 261.

The removal tool 150 and the turning tool 160 cooperate with respect to a transfer of chips 192, i.e., FCOB chips 292a and/or COB chips 292b, in a common transfer position 246. According to the exemplary embodiment represented here, this common transfer position 246 in the case of the rotatable removal tool 150 corresponds to a so-called "9 o'clock position" and in the case of the rotatable turning tool 160 to the "3 o'clock position". The removal of chips from the wafer 195 occurs at the "6 o'clock position" of the removal tool 150. The first collection position 256 is situated at the "12 o'clock position" of the removal tool 150, the second collection position 266 is situated at the "12 o'clock position" of the turning tool 160.

For a reliable handling of chips 192, 292a, 292b, it is necessary for the first suction gripper 252 which removes a chip 192 from the wafer 195 to be movable in the radial direction (with respect to the first axis of rotation 251). Such a radial displacement upon removing of chips 192 is illustrated in FIG. 2 by a double arrow 260a. Moreover, it is required that at least one of a first suction gripper 252 and a second suction gripper 262, both of which are involved in a transfer of a chip 192 between the removal tool 150 and the turning tool 160, is displaceable in the radial direction. Preferably, such a radial displacement occurs in the region of the transfer position 246 by a radial displacement of the respective first suction gripper 252. The turning tool 160 can then be realised, specifically with regard to the second suction gripper 262, as a largely passive tool and thus with a simple design and also in an economical manner. The same holds for the supplementary tool, not shown in FIG. 2. A radial displacement during the transfer of chips 192 is indicated by a double arrow 260b.

The radial displacements 260a, 260b of the first suction grippers 252 occur by means of radial drives 282. According to the exemplary embodiment represented here, one dedicated radial drive 282 is associated with each first suction gripper 252.

Each of the suction grippers is situated at a gripper receiving location 245. In known manner, this location comprises a so-called quill (not shown), on which the respective suction gripper can be mounted. Through a central bore of the quill, the respective suction gripper is supplied with a partial vacuum.

A radial displaceability of a first suction gripper 160 at the first collection position 256 and a radial displaceability of a second suction gripper 180 at the second collection position 266 is typically not required, because the chip holding devices 138 of the placement head 136 can generally travel along a z-direction and can move up gently to the respective collection position 256, 266 when collecting a chip 292a or a chip 292b.

Instead of the above described individual radial drives 282 (one radial drive 282 associated with each first suction gripper 252), the radial displaceability can also be realised by at least one shared radial drive. In the case of shared radial drives, a mechanical engagement between a radial drive firmly assigned to the working position and the first suction gripper 252 located in the corresponding working position occurs only at the respective working position, i.e., here, at the "6 o'clock position" for collecting of chips 192 and at the "9 o'clock position" for transfer of chips 192.

Figure 3:
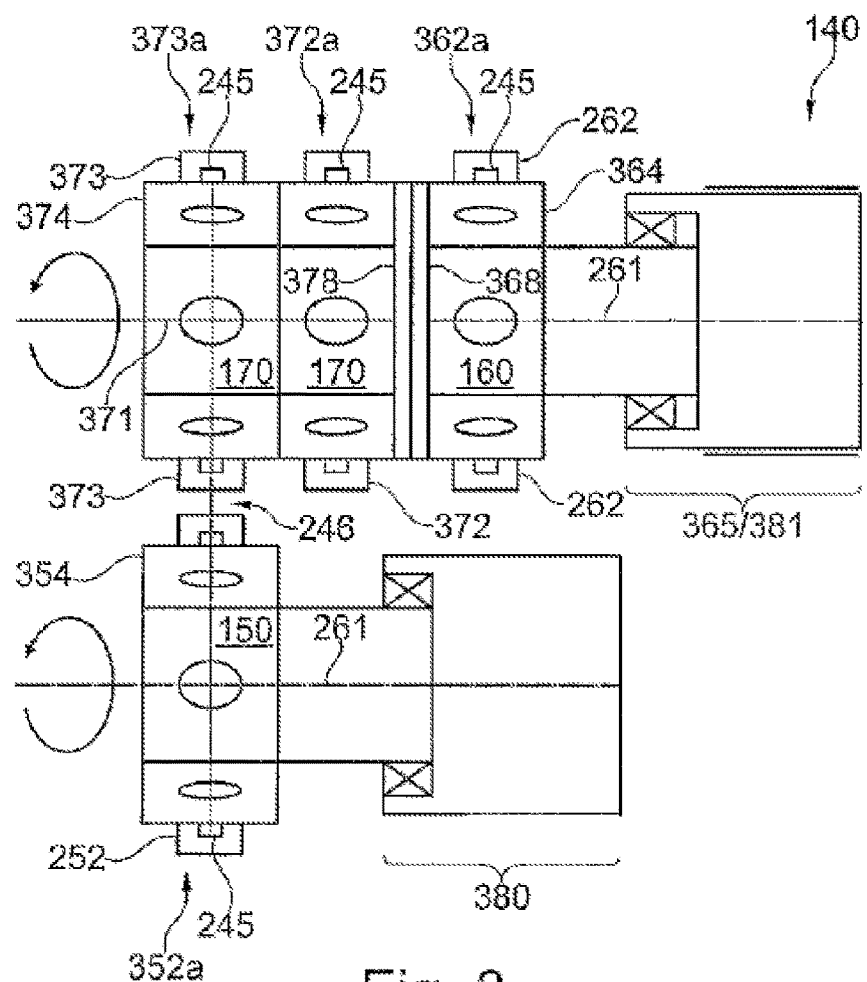
FIG. 3 shows, in an enlarged and schematic representation, a chip transfer system with a supplementary tool mounted on the turning tool, which has two planes of suction grippers.

FIG. 3 shows an enlarged and schematic representation of a chip transfer system 140 with a removal tool 150 and a supplementary tool 170 mounted on the turning tool 160, which has two planes of suction grippers.

The removal tool 150 comprises a chassis 354, which can be turned by means of a rotation drive 380 about the first axis of rotation 261. Each of the first suction grippers 252 is mounted on a gripper receiving location 245 and is supplied with a partial vacuum in a known manner by means of a respective hollow quill. The first suction grippers 252 are arranged radially protruding from the first axis of rotation 261 in a first plane 352a, which is oriented perpendicular to the first axis of rotation 261. In corresponding manner, a second plane 362a is associated with the removal tool 160, which plane is oriented perpendicular to the second axis of rotation 261 and in which plane the second suction grippers 262 are arranged. The turning tool 160 moreover comprises a chassis 364, on which each of the second suction grippers 262 is mounted at a gripper receiving location 245. The chassis 364 is turned together with the second suction grippers 262 about the second axis of rotation 261 by a rotation drive 381.

The turning tool 160 moreover comprises a first interface 368, at which a supplementary tool 170 can be mounted in releasable manner, rotationally fixed and concentric to the second axis of rotation 261. The supplementary tool 170 has a center axis 371, which coincides in the mounted state with the second axis of rotation 261.

For the reliable mounting of the supplementary tool 170 at the first interface 368, the supplementary tool 170 comprises a second interface 378. The two interfaces 368 and 378 are shown schematically in FIG. 3 and make possible, besides a reliable mechanical fastening, also a transfer of a partial vacuum, which is provided to the turning tool 160 (for purposes of the temporary holding of chips on the second suction grippers 262), to the supplementary tool 170 (likewise for the temporary holding of chips).

According to the exemplary embodiment represented here, the storage tool 170 comprises two planes of suction grippers, each of which is attached in releasable manner to the supplementary tool 170 by means of a gripper receiving location 245 on a chassis 374 of the supplementary tool 170 protruding radially from the center axis 371. The further suction grippers 372, associated with a first star plane of the supplementary tool 170, are arranged in a plane which is denoted in this document as the further plane 372a. In corresponding manner, additional suction grippers 373 in a second star plane of the supplementary tool 170 are arranged in a plane which is denoted as the additional plane 373a.

In this context, "star plane" refers to the plane subtended by the center points of the tips of the suction grippers of a star row. A star plane can be defined either from the ideal or the actual positions of the center points of the suction gripper tips as determined by measurement.

The functional coupling or the functional cooperation of the removal tool 150 with a star plane of the turning tool 160 or the supplementary tool 170 occurs, as already explained above, at a common transfer position 246. By means of a displacement drive 365, a selected one of the three star planes or a selected plane (the second plane 362a, the further plane 372a or the additional plane 373a) can be displaced along the second axis of rotation 261 or the center axis 371 and aligned with the first plane 352a of the removal tool 150, so that the common transfer position of the desired suction grippers of the suction grippers 262, 372 or 373 is reached.

Figure 4:
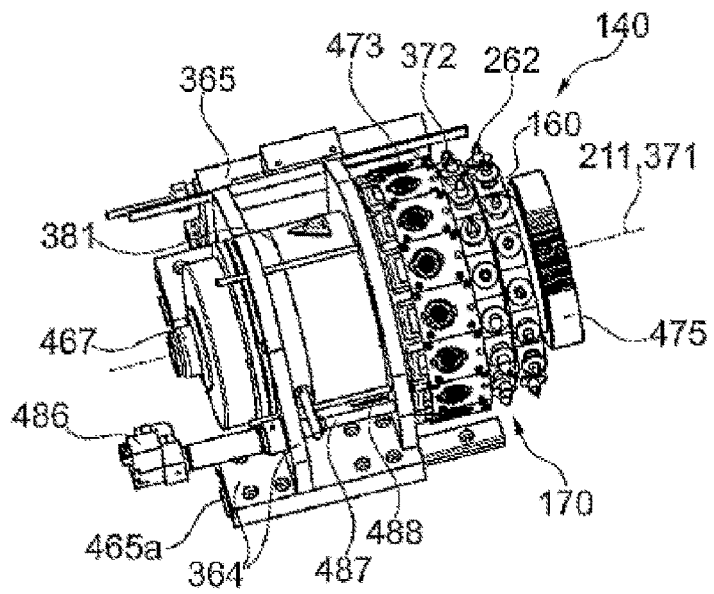
FIG. 4 shows, in a perspective representation, a portion of a chip transfer system according to one exemplary embodiment of the invention.

FIG. 4 shows a perspective representation of a portion of a chip transfer system 140 according to one exemplary embodiment of the invention. One can recognize the turning tool 160, which comprises a star plane with second suction grippers 262. On the turning tool 160 there is mounted, by means of interfaces not shown, a supplementary tool 170, which according to the exemplary embodiment represented here comprises two star planes, each with a plurality of suction grippers 372, 473, which serve the following different purposes:

(A) The further suction grippes 372, like the second suction grippers 262, serve for the temporary holding of chips which have been received from the removal tool, not shown. The second suction grippers 262 and the further suction grippers 372 may be different in configuration, so that for example a first kind of chips can be firmly grasped with the second suction grippers 262 and a second kind of chips with the further suction grippers 372.

The additional suction grippers 473 are so-called change suction grippers. As can be seen from FIG. 4, these are arranged in an inverted orientation on the supplementary tool 170. This means that the tips of the suction grippers 473 on which a component is being held point inward, i.e., in the direction of the center axis 371. Now, if one suction gripper of the removal tool, not shown, is worn down or for other reasons needs to be replaced by one of the suction grippers 473, then a change suction gripper 473 can be transferred to the removal tool in a suitable angular position of removal tool and supplementary tool 170 at the common transfer position. The change suction gripper 473 will be transferred at a gripper receiving location, the suction gripper being replaced having been previously removed in suitable manner.

For the securing of the supplementary tool 170 on the turning tool 160, a fixation element 475 is provided as a rotary handle according to the exemplary embodiment represented here. A linear guide 465a ensures that, upon activation of the displacement drive 365, the assembly of turning tool 160 and supplementary tool 170 is moved precisely along the second axis of rotation 261 or the center axis 371 and the transfer position is reached exactly by the respective star plane.

The rotation drive 381 shown only schematically in FIG. 3 is mounted on the chassis 364. By means of a pneumatic interface 487, both the turning tool 160 and the supplementary tool 170 are supplied with a partial vacuum.

In order to ensure a frictionless transfer (with no major expenditure of force) of change suction grippers 473 to the removal tool, the change suction grippers 473 are merely inserted in corresponding receiving openings of the supplementary tool 170. So that the change suction grippers 473 do not drop out upon rotation of the supplementary tool 170, they are held by a suitable locking mechanism, not shown in detail, in the respective receiving opening. According to the exemplary embodiment represented here, this locking mechanism comprises a closing plate. For the transfer of a change suction gripper 473, this plate is then released by an unlocking element 487 activated by an unlocking actuator 486. In order to ensure high operating reliability, the position of the unlocking element 487 is monitored by a sensor 488.

Figure 5:
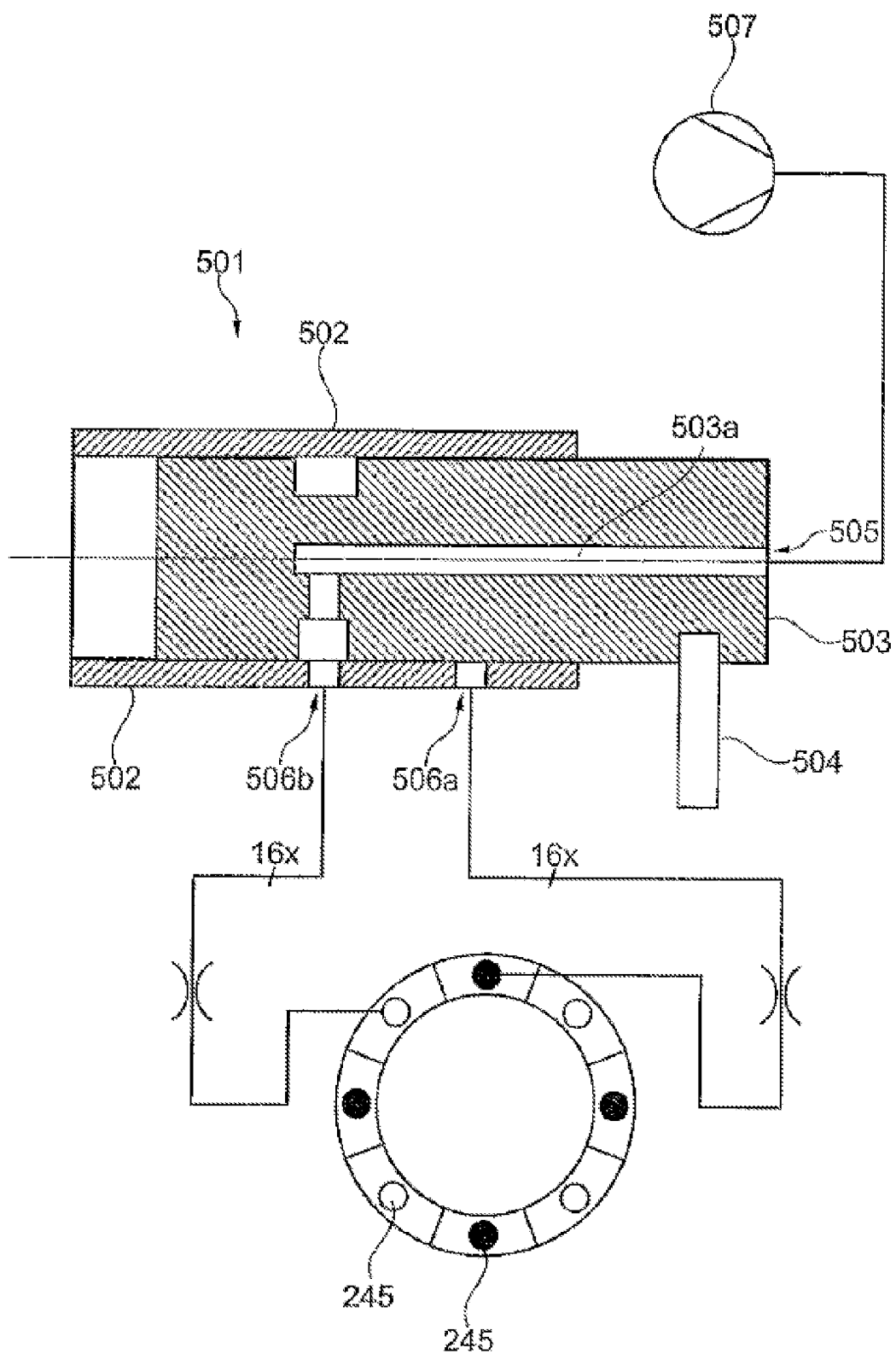
FIG. 5 shows a pneumatic system with a pneumatic shunt element.

FIG. 5 shows a pneumatic system with a pneumatic shunt element 501, which is located in the chassis of the turning tool and is provided to supply a partial vacuum to an (active) star plane of the turning tool and an (active) star plane of the supplementary tool.

The pneumatic system comprises a vacuum generator 507, which supplies a partial vacuum to a pneumatic inlet 505 of the shunt element 501. The pneumatic shunt element 501 moreover comprises two pneumatic outlets, a first pneumatic outlet 506a and a second pneumatic outlet 506b. The pneumatic outlet 506a is associated with a first star plane of second suction grippers, each of which is mounted at a gripper receiving location 245 (in FIG. 5 represented by a solid circle). In corresponding fashion, the pneumatic outlet 506b is associated with a second star plane of further suction grippers, each of which is mounted at a gripper receiving location 245 (in FIG. 5 represented by a clear circle).

It is pointed out that the number of pneumatic outlets is not limited to two. In particular, when multiple star planes are used, all star planes can be selectively subjected to a partial vacuum by a corresponding number of pneumatic outlets.

According to the exemplary embodiment represented here, the pneumatic shunt element is realised by means of a piston spool valve 501, which comprises a sleeve 502 and a piston 503 which can move axially therein. In the piston 503 there is formed an air duct 503a, which pneumatically couples the pneumatic inlet to one of the two pneumatic outlets 506a or 506b depending on the axial position of the piston 503.

According to the exemplary embodiment represented here, the axial displacement of the piston 503 occurs by means of a driver element 504, which is coupled to the displacement drive not shown (cf. reference number 365 in FIG. 4).

In the following, several further sometimes optional design aspects and further features and advantages of exemplary embodiments of the placement system 100 described in this document and its chip transfer system 140 shall be explained with reference to all of the figures:

The turning tool 160 comprises multiple axially offset star planes, which are denoted in the foregoing as second plane 362a, further plane 372a and additional plane 373a. With each star plane, chips can be stored temporarily and/or transferred to a placement head in COB orientation. Preferably, only that star row is active (i.e., in use) whose star plane coincides at least substantially with the star plane of the removal tool. Further preferably, the star planes are outfitted with different types of suction grippers, so that the turning tool can handle different chips in reliable and time-optimal manner without a change of suction grippers.

Several star rows can have the same or a different number of suction grippers. In the case of the same number of suction grippers, the star planes of the turning tool are advantageously set off from each other by half of the angular star pitch. The pipettes can thereby be arranged very compactly, which yields the following technical advantages:

(i) minimized axial design space for the turning tool
(ii) reduced travel distances of the linear displacement drive
(iii) simplified pneumatic supply of the suction grippers of different star planes, since the pneumatic supply lines of a second star plane can be led without deflections through the gaps between the suction grippers of a first star plane.

The at least one star plane of the supplementary tool may optionally be removable from the turning tool. In this way, the supplementary tool may be removed from the chip transfer system or the automatic placement machine by an attendant for the outfitting of suction grippers. As is known for conventional magazines with (change) suction grippers for automatic placement machines, this work can thus be done advantageously outside the chip transfer system or the automatic placement machine. A fixation of the supplementary tool may be done preferably by a receiving device, which orients and secures the supplementary tool with repeated accuracy in a distinct position. A releasable fixation can be done with repeated accuracy with a tool or with no tool. Alternatively, an automatic activation of the receiving device may occur by a control unit of the chip transfer system or the automatic placement machine. An automatic actuation can be done, for example, by a pneumatic or electric drive. Alternatively or in combination, the partial vacuum which is controlled by the above described pneumatic shunt element can be used to release the fixation.

After a mounting of the supplementary tool on the turning tool, an automatic identification can be done by a control unit of the chip transfer system or the automatic placement machine. In this way, parameters which are needed for the actuation of the chip transfer system can be automatically adjusted (e.g., layout of the supplementary tool, calibration factors, etc.). For this, the supplementary tool may have a suitable machine-readable encoding or marking, e.g., an optical (barcode, QR code, etc.) or electromagnetic (RFID) encoding. A corresponding reading device is integrated into the turning tool. An optical encoding of the supplementary tool may also alternatively be detected by existing camera systems of the automatic placement machine (e.g., a so-called circuit board camera) and be evaluated by an evaluation unit connected downstream.

The displacement drive by means of which the turning tool and the supplementary tool mounted thereon are moved in linear manner may have, in particular, the following features and advantages:

(i) The displacement drive moves the turning tool and/or the supplementary tool parallel to the axis of rotation of the turning tool or the center axis of the supplementary tool.

(ii) The selection of an active star plane occurs by a moving of the linear axis associated with the displacement drive to discrete positions, each of which is associated with a star plane. This may also be termed a "switchover movement" to activate different star planes. In this context, a star plane is designated as being active when it coincides at least approximately with the star plane of the removal tool.

(iii) The linear displaceability may also be used to compensate for position tolerances between the removal tool and the turning tool.

(iv) If the relative positions of the tips of all suction grippers of removal tool and turning tool are known (e.g., by a prior optical surveying), the suction grippers of removal tool and/or turning tool may then be brought to overlap in the common transfer position by a suitable compensation movement of the linear displacement drive. Such a compensation movement may be superimposed on the movement during the "switchover" between different star planes.

The pneumatic equipment by means of which the partial vacuum needed for the holding of chips is produced and provided to the individual active star planes may have for example the following features:

(i) In order to minimize the consumption of air involved in generating the partial vacuum, advantageously only the active star plane (i.e., the one situated opposite the removal tool) is coupled pneumatically to the vacuum equipment. The supply lines associated solely with the other star planes are pressureless or have substantially ambient pressure.

(ii) The switchover of the partial vacuum or the corresponding holding circuit between the different star planes preferably occurs by a piston spool valve, which is situated concentrically to the axis of rotation of the supplementary tool. The piston spool valve comprises a sleeve and a piston or control slide able to move axially therein. Preferably, it has no actuator of its own, but rather is forcibly activated by a linear axis of the displacement drive for the turning tool (and the supplementary tool) and a driver element when a changing occurs between the star planes. The driver element may be arranged on the base plate of the chip transfer system and establish the axial position of the control slide in the sleeve.

When a suction gripper of the removal tool is in the common transfer position, a transfer of a chip to the turning tool or the supplementary tool can be assisted by a so-called blowing pulse and/or by a separate vacuum supply for the suction gripper which is supposed to receive the chip. This separate vacuum supply may be active only in the common transfer position. Such a separate vacuum supply may be realised, e.g., by a grinding wheel which supplies all the star planes. The grinding wheel is preferably designed such that no crosstalk is possible between the supply lines of two suction grippers upon a rotation of the turning tool and/or the supplementary tool.

Optionally, one or more star planes of the turning tool may also be designed as a magazine with a plurality of devices for holding auxiliary tools that are needed within the chip transfer system or the automatic placement machine. The auxiliary tools may be, for example, suction grippers or pipettes for the placement head or ejector tools for releasing or ejecting a chip from the wafer assembly. In particular, such a magazine may provide additional (change) suction grippers for the removal tool. In this way, the handling of different chips with the removal tool is possible, since the suction grippers are changed automatically and without standstill of the chip transfer system or the automatic placement machine.

Regarding the number of magazine slots for a respective suction gripper, there are various preferred embodiments:

(i) A star plane contains at least the number of suction grippers of the removal tool plus ONE. In this way, it is possible to keep on hand a complete set of suction grippers. The free magazine slot can be used to change the suction grippers of the removal tool in succession by the method described below.

(ii) A star plane contains at least an integer multiple (such as a multiple of 4) of the number of suction grippers of the removal tool plus ONE. In this way, several sets of suction grippers can be stored in one star plane.

(iii) The number of the magazine slots may coincide with the number of suction grippers in the other star rows of the turning tool.

The above described magazine for suction grippers, also known as a pipette magazine for short, may have the following features and advantages:

(i) The pipette magazine is a passive storage device. The actuators and sensors required for the operation may be integrated into the turning tool. In this way, a robust and economical design of the pipette magazine is possible.

(ii) The magazine slots are arranged radially such that the stroke of the radial drives of the removal tool needed for the removing or inserting of a suction gripper in a magazine slot is minimized.

(iii) The pipettes may be held in the magazine slots by closing plates with positive locking. The closing plates are normally closed, so that the suction grippers are held firmly, even during dynamic rotations of the supplementary tool. The closing plates are preferably activated independently of each other, so that always only one magazine slot is freed up. The locking of the closing plates is done for example by a suitable arrangement of compression springs.

(iv) In the normal operation of the feeding device, the closing plates of the magazine slots are activated solely in the transfer position. For this, the turning tool comprises an unlocking actuator, which moves a closing plate axially (i.e., along the star axis of the turning tool) until a magazine slot is freed up and a pipette can be removed or inserted. The unlocking actuator is advantageously arranged on a linear carriage of the turning tool. For example, pneumatic cylinders or lifting magnets are suitable for the unlocking actuator.

(v) In order to detect the state of the closing plates, a suitable closing plate sensor is provided at the unlocking actuator (e.g., optical, magnetic, inductive, capacitive). It detects the axial position of the closing plate which is precisely in the transfer position. In this way, on the one hand the opening of the closing plate can be monitored by the unlocking actuator and based on this, a changing of a suction gripper can be initiated. On the other hand, during a rotation of the supplementary tool the state of all closing plates can be monitored and a defective closing plate can be detected in combination with the measured angular position of the supplementary tool (security function).

The supplementary tool may be modular in design. This means that different supplementary tools can be mounted on the turning tool, without having to alter the first interface of the turning tool for this. This makes possible an easy interchangeability of a supplementary tool with another supplementary tool. Depending on the application, the turning tool can thus be fitted with different supplementary tools having a different number of star planes and/or a different number of suction grippers per star plane.

Moreover, for purposes of compensating tolerances, the removal tool may have an additional linear axis with a corresponding drive, which linear axis is oriented perpendicular to the axis of rotation of the turning tool.

In the following, a currently preferred method shall be described for the changing or switchover of the active star plane on the turning tool or the supplementary tool. This changing is preferably initiated or demanded by a control unit of the chip transfer system or the automatic placement machine. The initiation occurs once no more chips are present on the currently active star plane. That is, the changing occurs after all COB chips have been collected by the placement head or all FCOB chips have been transferred to the removal tool:

(1) The changing of the star row is done by an activating of the displacement drive of the turning tool. This drive moves under position regulation until the required or desired star plane of the removal tool or the supplementary tool coincides at least approximately with the star plane of the removal tool.

(2) If optionally the actual positions of the center points of the tips of the suction grippers are known (e.g., by a suitable optical surveying), then a suitable offset correction can be done with the displacement drive in order to bring the suction grippers of removal tool and turning tool or supplementary tool situated opposite each other in the common transfer position into overlap.

In the following, a currently preferred method shall be described for the changing of suction pipettes of the removal tool. This changing of the suction pipettes of the removal tool is initiated or demanded by a control unit of the chip transfer system or the automatic placement machine. It is started after no more chips are present on the star planes of the turning tool and the removal tool:

(1) Transition to the star plane with the magazined suction grippers or to the pipette magazine of the turning tool or the supplementary tool according to the above described method for changing or switchover of the active star plane.

(2) Rotating of the removal tool until the suction gripper to be changed is situated in the common transfer position.

(3) Rotating of the turning tool until a free pocket for a suction gripper is located in the common transfer position.

(4) Opening of the pipette magazine by extending the unlocking actuator, preferably monitored by the closing plate sensor.

(5) Introducing of the suction gripper into the magazine slot by extending of the radial drive situated at the common transfer position (after freeing up the magazine slot).

(6) Closing of the pipette magazine by retracting of the unlocking actuator.

(7) Pulling out of the suction gripper by the removal tool by retracting of the radial drive situated in the common transfer position.

(8) Rotating of the turning tool until the pocket with the suction gripper being swapped in is situated in the common transfer position.

(9) Receiving of the suction gripper from the removal tool by extending of the radial drive situated in the common transfer position.

(10) Opening of the pipette magazine by activating of the unlocking actuator, preferably monitored by the closing plate sensor.

(11) Removal of the respective suction gripper from the pipette magazine by retracting of the radial drive situated in the common transfer position (after freeing up the magazine slot).

It should be mentioned that the term "comprise" does not preclude other elements and that "one" does not preclude the plural. It is also possible to combine elements which are described in connection with different exemplary embodiments. It should also be noted that reference numbers in the claims should not be interpreted as limiting the protection scope of the claims.

REFERENCE NUMBERS

100 Placement system
110 Automatic placement machine
112 Chassis
114 Data processing unit
120 Gantry system
122a First guide element/gantry base
122b Further first guide element/gantry base
124a Carriage
124b Carriage
125 Bearing elements
132 Second guide element/movable cross beam
134 Second carriage
136 Placement head
138 Chip holding devices/component holding devices
140 Chip transfer system
142 Chip transfer device
144 Data processing unit
150 Removal tool
160 Turning tool
170 Supplementary tool
190 Component holder/circuit board
192 Chips/(unpackaged) components
195 Wafer
y First direction
x Second direction
245 Gripper receiving location
246 Common transfer position
251 First axis of rotation
252 First gripper
256 First collection position
260a Radial displacement
260b Radial displacement
261 Second axis of rotation
262 Second gripper
266 Second collection position
282 Radial drive
292a FCOB chip
292b COB chip
352a First plane
354 Chassis
362a Second plane
364 Chassis
365 Displacement drive
368 First interface
371 Center axis
372 Further gripper
372a Further plane
373 Additional gripper
373a Additional plane
374 Chassis 378 Second interface
380 Rotation drive (for removal tool/supplementary tool)
381 Rotation drive (for turning tool/supplementary tool)
465a Linear guide
467 Pneumatic interface
473 Change gripper
475 Fixation element/rotary handle
486 Unlocking actuator
487 Unlocking element
488 Sensor (for locking mechanism/closing plate)
501 Pneumatic shunt element/piston spool valve
502 Sleeve
503 Piston
503a Air duct
504 Driver element
505 Pneumatic inlet
506a Pneumatic outlet
506b Pneumatic outlet
507 Vacuum generator

The invention claimed is:

1. A chip transfer device for transferring chips from a wafer to a placement head of an automatic placement machine, the chip transfer device comprising:
   first and second rotatable tools, the first rotatable tool comprising a rotatable removal tool rotatable about a first axis of rotation, the rotatable removal tool being configured to
   remove singulated chips from the wafer, and to
   turn the removed chips to provide the removed chips as Flip-Chip-on-Board (FCOB) chips at a first collection position, and to
   transfer, at a common transfer position, the removed chips to a rotatable turning tool which is rotatable about a second axis of rotation parallel to the first axis of rotation; and
   the second rotatable tool comprising a rotatable turning tool which is configured to
   receive removed chips from the rotatable removal tool, and is further configured to
   again turn the chips so received, in order to provide them as Chip-on-Board (COB) chips at a second collection position;
   wherein the rotatable removal tool has a plurality of first grippers each for temporarily receiving one chip, the first grippers being configured and arranged for protruding radially from the first axis of rotation and in a first plane,
   wherein the rotatable turning tool has a plurality of second grippers each for temporarily receiving one chip, the second grippers being configured and arranged for radially protruding from the second axis of rotation and in a second plane parallel to the first plane,
   wherein at least one rotatable removal tool has a first interface, enabling mounting of a supplementary tool with a plurality of third grippers, which are configured and arranged for radially protruding from a center axis of a supplementary tool in a third plane parallel to the first plane when the supplementary tool is mounted, and
   wherein the first interface is formed such that the center axis coincides with the first axis of rotation or with the second axis of rotation when the supplementary tool is mounted.

2. The chip transfer device of claim 1, wherein the at least one rotatable removal tool with the first interface comprises:
   a chassis; and
   a displacement drive mounted on the chassis for displacing (i) the first grippers of the rotatable tool and (ii) the third grippers of the supplementary tool along the axis of rotation of the rotatable removal tool;
   optionally, the chip transfer device further comprises a pneumatic interface for the controlled application of a partial vacuum to the first grippers of the rotatable removal tool with the first interface;
   optionally, the chip transfer device further comprises a pneumatic shunt element, which is connected downstream of the pneumatic interface and which is configured to apply a partial vacuum only to those of the grippers associated with a selected plane of the grippers, depending on the current position of the pneumatic shunt element;
   optionally, the pneumatic shunt element is coupled to the displacement drive such that those grippers associated with the selected plane of grippers are automatically subjected to a partial vacuum.

3. The chip transfer device of claim 1, further comprising a plurality of actuable radial drives, and one of the radial drives is associated with each of the grippers of the rotatable removal tool, the rotatable turning tool and the supplementary tool so that the respective gripper can be moved in the radial direction with respect to one of the particular axes of rotation.

4. The chip transfer device of claim 3, wherein the grippers of the rotatable tool without the first interface are each associated with a radial drive.

5. The chip transfer device of claim 3, wherein no radial drive is associated with the grippers of the rotatable removal tool with the first interface and/or with the grippers of the supplementary tool.

6. The chip transfer device of claim 1, wherein the first grippers, the second grippers and/or the third grippers are spring-mounted at least in the radial direction.

* * * * *